United States Patent
O'Shea et al.

(10) Patent No.: US 6,987,470 B2
(45) Date of Patent: Jan. 17, 2006

(54) METHOD TO EFFICIENTLY GENERATE THE ROW AND COLUMN INDEX FOR HALF RATE INTERLEAVER IN GSM

(75) Inventors: Helena Deirdre O'Shea, San Diego, CA (US); Ryan Milne, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 217 days.

(21) Appl. No.: 10/719,079

(22) Filed: Nov. 21, 2003

(65) Prior Publication Data

US 2005/0110663 A1    May 26, 2005

(51) Int. Cl.
    H03M 7/00    (2006.01)
    G06F 12/00   (2006.01)
    G06F 13/00   (2006.01)

(52) U.S. Cl. .......................... 341/81; 711/157
(58) Field of Classification Search .............. 341/81; 348/470; 370/280, 294, 311, 432; 375/273; 704/201, 229; 711/5, 157; 714/701, 776
    See application file for complete search history.

(56) References Cited

U.S. PATENT DOCUMENTS

| | | | |
|---|---|---|---|
| 5,293,607 A * | 3/1994 | Brockmann et al. ........... 711/5 |
| 5,438,369 A * | 8/1995 | Citta et al. ................... 348/470 |
| 5,517,492 A * | 5/1996 | Spear ........................ 370/280 |
| 5,570,369 A * | 10/1996 | Jokinen ...................... 370/311 |
| 5,668,974 A * | 9/1997 | Grassi et al. ............... 711/157 |
| 6,035,434 A * | 3/2000 | Sazzad et al. ............... 714/776 |
| 6,101,465 A * | 8/2000 | Sazzad et al. ............... 704/229 |
| 6,118,827 A * | 9/2000 | Wynn ........................ 375/273 |
| 6,198,748 B1 * | 3/2001 | Bruckert ..................... 370/432 |
| 6,324,504 B1 | 11/2001 | Sazzad et al. ............... 704/229 |
| 6,606,718 B1 * | 8/2003 | Bessios ...................... 714/701 |
| 6,772,112 B1 * | 8/2004 | Ejzak ........................ 704/201 |
| 6,813,252 B2 * | 11/2004 | Chang et al. ............... 370/294 |

FOREIGN PATENT DOCUMENTS

EP    0660558    12/1994

* cited by examiner

*Primary Examiner*—Patrick Wamsley
(74) *Attorney, Agent, or Firm*—Philip R. Wadsworth; Charles D. Brown; Howard H. Seo

(57) ABSTRACT

A method and apparatus for interleaving bits in a first sequence is disclosed. An exemplary method comprises storing a set of offset values in at least one table, applying in order each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits. The table is significantly shorter, requiring less memory than that used in a conventional interleaver, particularly a GSM interleaver for half rate speech.

27 Claims, 6 Drawing Sheets

| b= | 0 | 1 | | b= | 2 | 3 |
|---|---|---|---|---|---|---|
| j=0 | k=0 | 150 | | j=1 | k=1 | 151 |
| 2 | 38 | 188 | | 3 | 39 | 189 |
| 4 | 76 | 226 | | 5 | 77 | 227 |
| 6 | 114 | 14 | | 7 | 115 | 15 |
| 8 | 152 | 52 | | 9 | 153 | 53 |
| 10 | 190 | 90 | | 11 | 191 | 91 |
| | 18 | 128 | | | 19 | 129 |
| | 56 | 166 | | | 57 | 167 |
| | 94 | 204 | | | 95 | 205 |
| | 132 | 32 | | | 133 | 33 |
| 20 | 170 | 70 | | 21 | 171 | 71 |
| | 208 | 108 | | | 209 | 109 |
| | 8 | 146 | | | 9 | 147 |
| | 46 | 184 | | | 47 | 185 |
| | 84 | 222 | | | 85 | 223 |
| 30 | 122 | 10 | | 31 | 123 | 11 |
| | 160 | 48 | | | 161 | 49 |
| | 198 | 86 | | | 199 | 87 |
| | 28 | 124 | | | 29 | 125 |
| | 66 | 162 | | | 67 | 163 |
| 40 | 104 | 200 | | 41 | 105 | 201 |
| | 142 | 30 | | | 143 | 31 |
| | 180 | 68 | | | 181 | 69 |
| | 218 | 106 | | | 219 | 107 |
| | 4 | 144 | | | 5 | 145 |
| 50 | 42 | 182 | | 51 | 43 | 183 |
| | 80 | 220 | | | 81 | 221 |
| | 118 | 6 | | | 119 | 7 |
| | 156 | 44 | | | 157 | 45 |
| | 194 | 82 | | | 195 | 83 |
| 60 | 22 | 120 | | 61 | 23 | 121 |
| | 60 | 158 | | | 61 | 159 |
| | 98 | 196 | | | 99 | 197 |
| | 136 | 24 | | | 137 | 25 |
| | 174 | 62 | | | 175 | 63 |
| 70 | 212 | 100 | | 71 | 213 | 101 |
| | 12 | 138 | | | 13 | 139 |
| | 50 | 176 | | | 51 | 177 |
| | 88 | 214 | | | 89 | 215 |
| | 126 | 2 | | | 127 | 3 |
| 80 | 164 | 40 | | 81 | 165 | 41 |
| | 202 | 78 | | | 203 | 79 |
| | 34 | 116 | | | 35 | 117 |
| | 72 | 154 | | | 73 | 155 |
| | 110 | 192 | | | 111 | 193 |
| 90 | 148 | 26 | | 91 | 149 | 27 |
| | 186 | 64 | | | 187 | 65 |
| | 224 | 102 | | | 225 | 103 |
| | 16 | 140 | | | 17 | 141 |
| | 54 | 178 | | | 55 | 179 |
| 100 | 92 | 216 | | 101 | 93 | 217 |
| | 130 | 20 | | | 131 | 21 |
| | 168 | 58 | | | 169 | 59 |
| | 206 | 96 | | | 207 | 97 |
| | 36 | 134 | | | 37 | 135 |
| 110 | 74 | 172 | | 111 | 75 | 173 |
| 112 | 112 | 210 | | 113 | 113 | 211 |

FIG. 3

METHOD TO EFFICIENTLY GENERATE THE ROW AND COLUMN INDEX FOR HALF RATE INTERLEAVER IN GSM

BACKGROUND

1. Field of the Invention

The present invention relates to cellular communication systems. Particularly, the present invention relates to systems and methods for implementing an interleaver in a digital cellular communication system.

2. Description of the Related Art

Cellular communications have exploded worldwide in recent years. In undeveloped areas, it has proven a cost effective means of compensating for a lack of infrastructure, providing ready communication links years ahead of any possible deployment of land line systems. In developed areas, cellular systems offer convenience and new features that have quickly grown to become an indispensable adjunct to the existing phone system. As cellular has become ubiquitous, standards have naturally developed in order to reduce the need for duplicate hardware.

The global system for mobile communications (GSM) is a digital cellular communications standard which was initially developed in Europe and has gained rapid acceptance and market share worldwide. It was originally designed to be compatible with the integrated services digital network (ISDN) standard. Thus, the services provided by GSM are a subset of the standard ISDN services, speech being the most basic. A broader range of criteria in the development of GSM include spectrum efficiency, international roaming, low cost mobile and base stations, voice quality and the ability to support new services. Over time, the GSM standard has broadened and evolved to include a variety of channel and coding formats.

Fundamentally, the GSM standard calls for interleaving, a process of transmission bit reordering to make the transmission more robust; interference effects and other harmful influences are diminished overall in the received transmission. However, performing the interleaving process can be memory intensive, requiring storage of large tables that guide bit reordering. This places a burden on transmission and reception.

There is a need for efficient methods and apparatuses for performing interleaving, particularly for the GSM standard. As detailed hereafter, these and other advantages are obtained with the present invention.

SUMMARY

The present invention employs a compact algorithm using a set of offsets that can be stored in one or more short look up tables. The invention is particularly applicable to implement GSM interleaving. Embodiments of the present invention avoid having to reserve an excessive amount of memory for the large table conventionally employed in interleaving.

A typical interleaving method of the invention comprises storing a set of offset values in at least one table, applying in order each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits. The table is significantly shorter than that used in conventional interleavers, particularly a GSM interleaver for half rate speech. The upper limit can be a total number of the bits in the first sequence and each of the set of offset values is repeatedly incremented by a fixed increment until the upper is reached.

Similarly, an exemplary apparatus for interleaving includes a memory for storing a set of offset values in at least one table and a processor for applying in order each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits. The interleaver apparatus can be implemented consistent with conventional interleaver implementations known to those skilled in the art. However, significantly less memory is required. The row and column index is not stored in its entirety as with conventional interleavers, but effectively reproduced in operation from a set of offset values and an algorithm with embodiments of the present invention.

In a typical embodiment of the invention, for each bit pair, a first bit of the pair is assigned to a first interleaved sequence of a first interleaved burst and a second bit of the pair is assigned to a second interleaved sequence of a second interleaved burst and the new interleaved sequence of the bits comprises the first and second interleaved bursts. For example, the new interleaved sequence of the bits can comprise four bursts including two even numbered interleaved bursts and two odd numbered interleaved bursts and the bit pairs. A first even numbered burst and a first odd numbered burst can comprise even numbered bits of the first sequence and a second even numbered burst and a second odd numbered burst can comprise odd numbered bits of the first sequence.

In an exemplary embodiment of the invention applicable to GSM interleaving for half rate speech, two sets of ten offset values in two tables can be used. For example, the first set of offset values can comprise {0, 18, 8, 28, 4, 22, 12, 34, 16, 36} and the second set of offset values can comprise {0, 22, 4, 26, 6, 30, 12, 34, 10, 16}. Each of the sets of offset values is repeatedly incremented by a fixed value of 38 until an upper limit of 228 (the total number of bits in the first sequence) is reached. Thus, a very tight loop can be employed with two very small look up tables each including only ten elements each.

BRIEF DESCRIPTION OF THE DRAWINGS

Referring now to the drawings in which like reference numbers represent corresponding parts throughout:

FIG. 3 is a table of GSM interleaving showing the values of b and j in dependence of k;

DETAILED DESCRIPTION

In the following description of the preferred embodiment, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

1. GSM Overview

Figure 1:
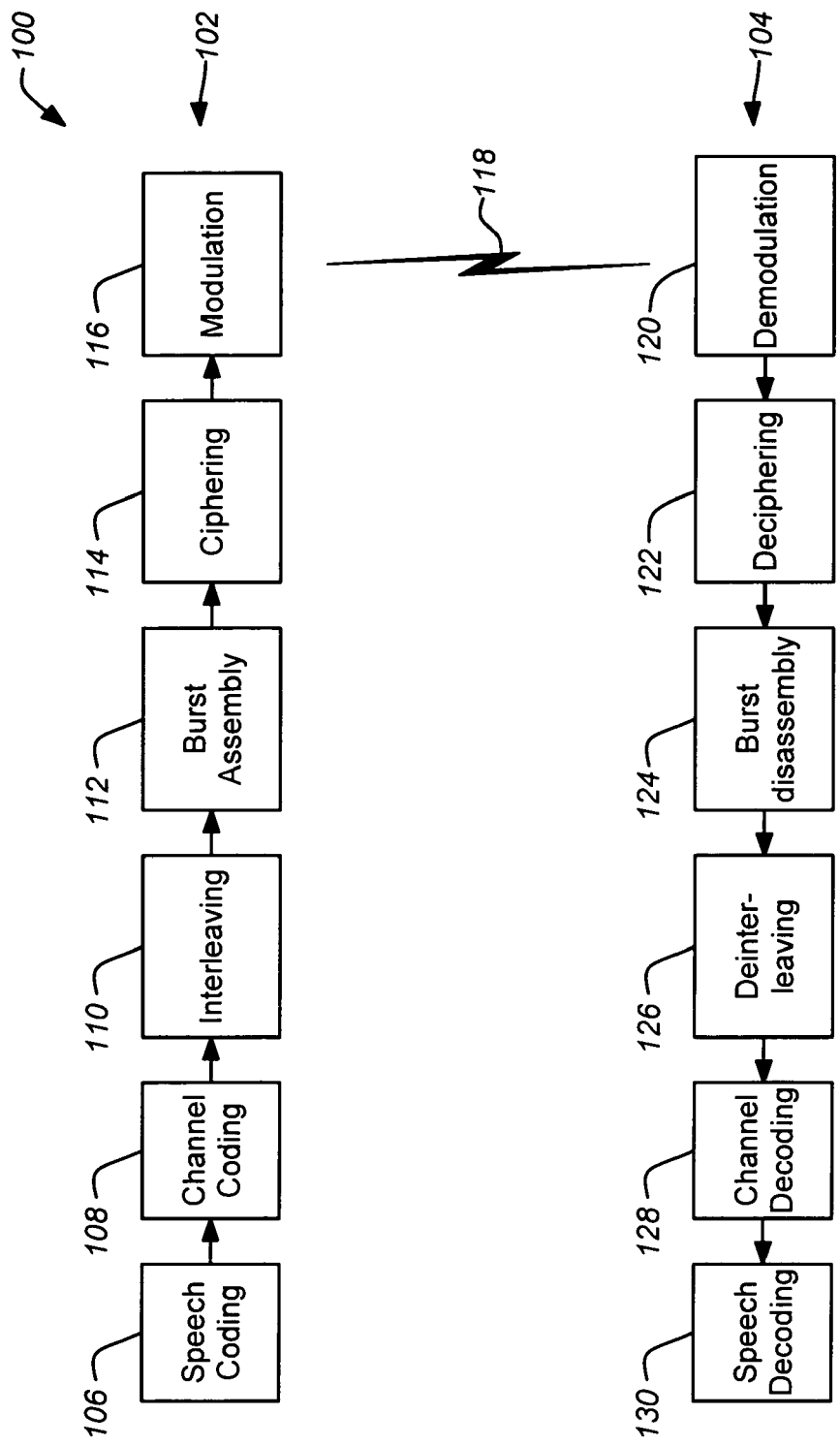
FIG. 1 is a block diagram of the basic operations of a GSM cellular system.

FIG. 1 is a block diagram of the basic operations of a GSM cellular system 100. The system 100 can be viewed as a series of processes which are performed on an audio source (e.g., speech) to take it from a source and reasonably reproduce it at a receiver. The source processes 102, represented by the top row of operations, can be performed by a mobile station (e.g., a cell phone). The receiving processes 104, represented by the bottom row of operations, can be performed at the base station. In general, the receiving processes 104 are the reverse of the source processes 102, performed in reverse order.

The GSM standard generally uses two frequency bands, each having a bandwidth of 25 MHz. One band, comprising the 890–915 MHz range, is allocated for uplink transmissions, transmitting from the mobile station to the base station. Another band, comprising the 935–960 MHz range, is allocated for downlink transmissions, transmitting from the base station to the mobile station. Depending upon frequency allocation within particularly countries, regional variations of the actually frequency bands can occur.

The GSM standard employs a multiple access scheme that defines how simultaneous communication can occur between different mobile stations and base stations. A geographic cell structure of base stations provides a spatial diversity for the defined frequency spectrum. Within each cell, a combination of frequency division multiple access (FDMA) and time division multiple access (TDMA) techniques are employed by the standard. Each 25 MHz band is divided into 124 carrier frequencies spaced at 200 kHz intervals applying FDMA. Each of the carrier frequencies is then timewise divided into eight bursts, each lasting approximately 0.577 ms applying TDMA. The eight bursts for each carrier are viewed as a single "frame", lasting approximately 4.615 ms; a single user will employ one of the bursts within the frame. In this manner individual "channels" are formed which each correspond to a particular carrier frequency and burst number. Referring back to FIG. 1, the communication process for a particular mobile to base station communication link according to the GSM standard can now be described.

Speech coding 106 at the first mobile base station converts incoming analog speech to a digital signal. The full rate speech codec for GSM, GSM 06.10 RPE-LTP, uses a regular pulse excitation long term prediction codec (RPE-LTP) to code the speech. The codec divides the speech signal into blocks of 20 ms at a net bit rate of approximately 13 kbps to yield blocks of 260 bits. The newer half rate speech codec, GSM 06.20 RPE-LTP, uses the half rate speech codec which divides the speech signal into blocks of 20 ms at a net bit rate of approximately 5.6 kbps to yield blocks of 112 bits. In general, these codecs use the information from previous samples (which remains relatively stable) to help predict a current sample. See $3^{rd}$ Generation Partnership Project; Technical Specification Group Services and System Aspects; Digital cellular telecommunications system (Phase 2+); Full rate speech; Transcoding (Release 99); 3GPP TS 06.10 V8.2.0 (2001–06) and European Standard (Telecommunications series); Digital cellular telecommunications system (Phase 2+); Half rate speech; Half rate speech transcoding (GSM 06.20 version 8.0.1 Release 1999), ETSI EN 300 969 V8.0.1 (2000–11), which are both incorporated by reference herein.

Channel coding 108 adds extra bits to the original information in order to aid in detecting and possibly correcting any errors occurring during the signal transmission. Channels can serve a variety of purposes, e.g. traffic (including speech or data) or control channels, and thus different coding formats are defined by the GSM standard depending upon the desired purpose and performance.

Each channel has its own coding and interleaving scheme. However, in the GSM standard the channel coding and interleaving is organized in such a way as to allow, as much as possible, a unified decoder structure. Each channel uses the following general sequence and order of operations. The information bits are coded with a systematic block code, building words of information and parity bits. The information bits and parity bits are then encoded with a convolutional code, building the coded bits. Next, the coded bits are reordered in an interleaving process. Following this, a stealing flag is added to yield the final interleaved bits. All these operations are made block by block, the size of which depends on the channel. However, most of the full rate channels use a block of 456 coded bits which is interleaved and mapped onto bursts in a very similar way for all of them.

A block of 456 coded bits is the basic structure of the channel coding scheme. In the case of full rate speech traffic channel (TCH), this block carries the information of one speech frame. In case of control channels, it carries one message. In the case of half rate speech TCH, the information of one speech frame is carried in a block of 228 coded bits. In the case of the enhanced full rate speech, the information bits coming out of the source codec first go through a preliminary channel coding. Then the channel coding as described above takes place. In the case of a packet switched channel, the block of 456 or 1384 coded bits carries one radio block. In the case of an enhanced circuit switched channel, the block of 1368 coded bits (456 coded symbols) carries one radio block. In the case of a fast associated control channel (FACCH), a coded message block of 456 bits is divided into eight sub-blocks. The first four sub-blocks are sent by stealing the even numbered bits of four timeslots in consecutive frames used for the TCH. The other four sub-blocks are sent by stealing the odd numbered bits of the relevant timeslot in four consecutive used frames delayed 2 or 4 frames relative to the first frame. Along with each block of 456 coded bits there is, in addition, a stealing flag (8 bits), indicating whether the block belongs to the TCH or to the FACCH. In the case of a slow associated control channel (SACCH), a broadcast control channel (BCCH), a common control channel (CCCH) or cordless telephony system control channel (CTSCCH), this stealing flag is a dummy. In the case of a packet switched channel, these bits are used to indicate the coding scheme used. In the case of an enhanced circuit switched data associated control channel (E-FACCH/F), a coded message block of 456 bits is divided into four sub-blocks. (Enhanced modulation scheme, designated by a "E-" prefix, indicates 8-PSK with three bits per symbol instead of classical binary Gaussian minimum shift keying (GMSK).) The four sub-blocks are sent by stealing all symbols of four timeslots in consecutive frames used for the enhanced circuit switched data (E-TCH) and using GMSK modulation. The indication of the E-FACCH/F is based on the identification of the modulation. Along with each block of 456 coded bits there is, in addition, a stealing flag (8 bits), indicating whether the block belongs to the E-FACCH, FACCH or TCH.

In addition, some cases do not fit in the general organization, and use short blocks of coded bits which are sent completely in one timeslot. They are the random access messages of the random access channel (RACH) or packet random access channel (PRACH) and compact packet random access channel (CPRACH) on uplink and the synchronization information broadcast on the synchronization channel (SCH) or the compact synchronization channel (CSCH) on the downlink. In the cordless telephony system (CTS), they are the access request message of the CTS access request channel (CTSARCH) on uplink and the information broadcast on the CTS beacon channel (CTSBCH-SB) on downlink.

For traffic channels, the channel coding 108 is generally performed by adding parity bits and then performing convolutional encoding. See, $3^{rd}$ Generation Partnership Project; Technical Specification Group GSM/EDGE Radio Access Network; Channel Coding (Release 1999), 3GPP TS 05.03 v. 8.7, 2003–04, which is incorporated by reference herein, for details related to the particular channel types. After channel coding 108, interleaving 110 is performed.

The interleaving 110 operation rearranges a group of bits in a particular way. The effect of interleaving is to reduce the likelihood of errors in the data stream. In general, because errors are more likely to affect consecutive bits within a burst, interleaving disperses the bits across bursts. Thus, the possibility of an unrecoverable error is diminished. As described in detail hereafter, the present invention involves an improved method and apparatus for performing the interleaving process. Particularly, the present invention applies to interleaving for a half rate speech TCH, although the principles described herein can be applied to other formats.

Following interleaving 110, the burst assembling 112 procedure groups the bits into bursts for transmission. At least four different types of bursts can be distinguished in the GSM standard. A normal burst is used to carry speech or data information. It lasts approximately 0.577 ms and has a length of 156.25 bits. The frequency-correction burst is used on the frequency correction channel (FCCH). The synchronization burst is used on the synchronization channel (SCH). Both the frequency-correction and synchronization bursts are the same length as the normal burst, but with a different structure. The random access burst is used on the random access channel (RACH) and is shorter than the normal burst.

Figure 2:
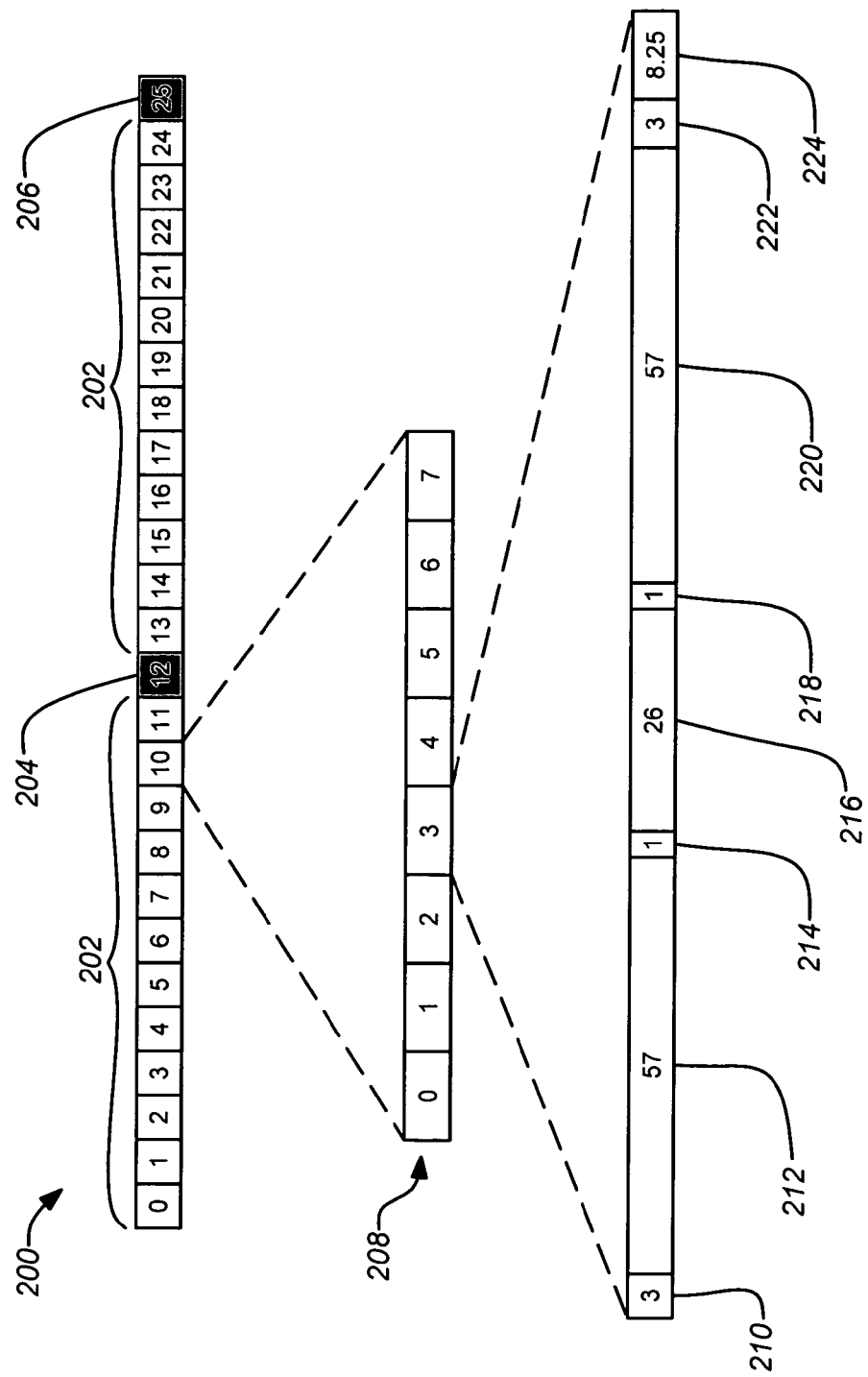
FIG. 2 illustrates a GSM burst structure.

FIG. 2 illustrates a normal burst structure 200. The normal burst structure 200 comprises a multi-frame including 26 individual frames (numbered 0 through 25). Traffic channels 202 occupy frames 0 through 11 and 13 through 24. Frame 12 is used for the slow associated control channel (SACCH) 204. Frame 25 is unused in the case of a single full rate traffic channel, but employed as a second SACCH 206 in the case of two half rate traffic channels. Furthermore, in the case of two half rate channels, the even numbered frames (except frame 12) are used as traffic for a first user and the odd numbered frames (except frame 25) are used as traffic for a second user. Each frame of the traffic channels 202 comprises 8 bursts 208 (numbered 0 through 7) and each burst 208 has a structure as follows. The tail bits groups 210, 222 each comprise three bits set to zero and disposed at the beginning and the end of a burst 208. They are used to cover the periods of ramping up and down of the mobile's power. Coded data groups 212, 220 each comprise 57 bits, containing signaling or user data. Stealing flags 214, 218 are used to indicate to the receiver whether the information carried by a burst 208 corresponds to traffic or signaling data. The training sequence 216 has a length of 26 bits. It is used to synchronize the receiver with the incoming information, avoiding then the negative effects produced by a multipath propagation. The guard period 224, with a length of 8.25 bits, is used to avoid a possible overlap of two mobiles during the ramping time.

Referring back to FIG. 1, ciphering 114 is used to protect signaling and user data. A ciphering key is computed using an algorithm (identified as algorithm A8) stored on the SIM card, the subscriber key and a random number delivered by the network. The random number is the same as the one used for the authentication procedure. In addition, a 114 bit sequence is produced using the ciphering key, an algorithm (identified as algorithm A5) and the burst numbers. An "exclusive or" operation is then performed with this bit sequence and the two 57 bit blocks of data included in a normal burst. In order to decipher correctly, the receiver must use the same algorithm (A5) for the deciphering procedure.

After ciphering 114, the transmitted signal 118 is formed by modulation 116. Typically, the GSM standard employs a Gaussian Minimum Shift Keying (GMSK) modulation. The GMSK modulation has been selected as a compromise between spectrum efficiency, complexity and low spurious radiation (reducing the possibilities of adjacent channel interference). The GMSK modulation has a rate of 270 ⅚ kbauds and a BT product equal to 0.3. Alternately, the GSM standard can also utilize an 8 phase shift keying (8-PSK) modulation for enhanced data for GSM evolution (EDGE) applications.

The modulated signal 118 is then transmitted to a receiver, e.g. a base station, where the receiving operations 104 are performed. In situations where the transmission recipient is communicated over a public switched telephone network (PSTN), the receiving operations 104 must be performed prior to communicating with the network. Similarly, return communication from the PSTN must also undergo source processes 102 before transmission to the mobile station. The receiving processes include (in order) demodulating 120, deciphering 122, burst disassembly 124, deinterleaving 126, channel decoding 128 and speech decoding 130. These operations are the inverse of their respective transmission operations discussed above.

As mentioned above, the present invention is concerned with implementing the interleaving 110 (as well as the comparable deinterleaving 126) processes. Particularly, the present invention implements interleaving for a half rate speech traffic channel (TCH/HS) according to the GSM standard.

2. Interleaving and Mapping a Speech Channel at Half Rate (TCH/HS)

For a speech channel, speech coding 106 delivers a sequence of blocks of data to the channel encoder. In case of a half rate speech TCH, one block of data corresponds to one speech frame. Each block contains 112 bits, including 95 bits of class 1 (protected bits), and 17 bits of class 2 (no protection). See, European Standard (Telecommunications series); Digital cellular telecommunications system (Phase 2+); Half rate speech; Half rate speech transcoding (GSM 06.20 version 8.0.1 Release 1999), ETSI EN 300 969 V8.0.1 (2000–11).

The bits delivered from speech coding 106 are received in the order indicated in GSM 06.20 before channel encoding. The rearranged bits are labeled $\{d(0),d(1), \ldots ,d(111)\}$. Four modes are identified, Mode 0 (indicating the speech encoder is in unvoiced mode) or Modes 1, 2 or 3 (indicating that the speech encoder is in a voiced mode).

Parity and tailing bit for a half rate speech frame are applied as follows. The most significant 22 class 1, bits d(73),d(74), . . . ,d(94), are protected by three parity bits used for error detection. These bits are added to the 22 bits, according to a cyclic code using the generator polynomial, g(D)=D3+D+1. The encoding of the cyclic code is performed in a systematic form, which means that, in the Galois field of order 2 (GF(2)), the polynomial, d(73)$D^{24}$+d(74)$D^{23}$+ . . . +d(94)$D^3$+p(0)$D^2$+p(1)D+p(2), where p(0), p(1), p(2) are the parity bits, when divided by g(D), yields a remainder equal to 1+D+$D^2$.

Tail bits and reordering for a half rate speech frame are applied as follows. The information and parity bits of class 1 are reordered, defining 104 information+parity+tail bits of class 1, {u(0),u(1), . . . ,u(103)} defined by u(k)=d(k) for k=0,1, . . . ,94, u(k)=p(k−95) for k=95,96,97, u(k)=0 for k=98,99, . . . ,103 (tail bits).

Convolutional encoding for half rate speech is performed as follows. The class 1 bits are encoded with the punctured convolutional code defined by the mother polynomials: G4=1+$D^2$+$D^3$+$D^5$+$D^6$, G5=1+D+$D^4$+$D^6$, G6=1+$D^2$+$D^3$+$D^4$+$D^6$ and the puncturing matrices: (1,0, 1) for {u(0),u(1), . . . ,u(94)} (class 1 information bits) and {u(98),u(99), . . . ,u(103)} (tail bits); and (1,1,1) for {u(95), u(96),u(97)} (parity bits). In the puncturing matrices, a 1 indicates no puncture and a 0 indicates a puncture. The coded bits {c(0),c(1), . . . ,c(227)} are then defined as follows. Class 1 information bits are defined by c(2k)=u(k)+u(k−2)+u(k−3)+(k−5)+u(k−6) and c(2k+1)=u(k)+u(k−1)+u(k−2)+u(k−3)+u(k−4)+u(k−6) for k=0,1, . . . ,94;u(k)=0 for k<0. Parity bits are defined by c(3k−95)=u(k)+u(k−2)+u(k−3)+u(k−5)+u(k−6), c(3k−94)=u(k)+u(k−1)+u(k−4)+u(k−6) and c(3k−93)=u(k)+u(k−1)+u(k−2)+u(k−3)+u(k−4)+u(k−6) for k=95,96,97. Tail bits are defined by c(2k+3)=u(k)+u(k−2)+u(k−3)+u(k−5)+u(k−6) and c(2k+4)=u(k)+u(k−1)+u(k−2)+u(k−3)+u(k−4)+u(k−6) for k=98,99,...,103. Finally, class 2 information bits are defined by c(k+211)=d(k+95)

for k=0,1, . . . ,16.

The coded bits are reordered and interleaved according to the following rule for a half rate speech frame: i(B, j)=c(n, k) for k=0,1, . . . ,227, n=0,1, . . . ,N,N+1, . . . and B=$B_0$+2n+b. Data blocks, B, are numbered, n, where N marks a particular data block. Bits are numbered, j and k in blocks or bursts. Bo marks the first block carrying bits from the data block with n=0.

FIG. 3 illustrates the values of b and j in dependence of k. For example, coded bit c(0, 50) (the 50$^{th}$ bit of the 0 data block from the convolution coder) becomes i(0, 74) (the 74$^{th}$ bit of the 0th column (modulo-6) burst payload from the interleaver), where $B_0$=0. Overall, the result of the interleaving is a distribution of the reordered 228 bits of a given data block, n=N, from the coder over 4 burst payloads from the interleaver using the even numbered bits of the first two burst payloads (B=$B_0$+2N+0 and B=$B_0$+2N+1) and the odd numbered bits of the last two burst payloads (B=$B_0$+2N+2 and B=$B_0$+2N+3) output from the interleaver. The reordered bits of the following data block, n=N+1, from the coder use the even numbered bits of the burst payloads B=$B_0$+2N+2, 3 (B= $B_0$+2(N+1)+0, 1) and the odd numbered bits of the burst payloads B=$B_0$+2(N+1)+2, 3 from the interleaver.

Continuing with the next data burst payloads shows that one interleaver output burst payload always carries 57 bits of data from one coder data block (n= N) and 57 bits from the next coder block (n=N+1), where the bits from the coder data block with the higher number always are the even numbered data bits of the interleaver output, and those of the coder data block with the lower number are the odd numbered bits of the interleaver output. Thus, the block of coded data is interleaved "block diagonal", where a new coder data block starts every 2nd interleaver burst payload column and is distributed over 4 interleaver burst payload columns.

The mapping of the interleaver column output payload on a burst is given by the rule, e(B, j)=i(B, j) and e(B, 59+j)=i(B, 57+j) for j=0,1, . . . ,56 and e(B, 57)=hl(B) and e(B, 58)=hu(B). The two bits, labeled hl(B) and hu(B) on burst number B are flags used for indication of control channel signaling. For each TCH/HS block not stolen for signaling purposes hu(B)=0 for the first 2 bursts (indicating status of the even numbered bits) and hl(B)=0 for the last 2 bursts (indicating status of the odd numbered bits).

3. Exemplary Method and Apparatus of Interleaving

Typical interleaver designs inefficiently require memory to store the entire table of FIG. 3 which can result in memory storage issues. According to the present invention, a studied evaluation of the table of FIG. 3 has revealed a repetitive pattern in the indices that can be exploited such that it is not necessary to store the entire table in memory. Rather, the same result can be achieved more efficiently through the use of a shorter table (or multiple tables) and a rule.

Figure 4:
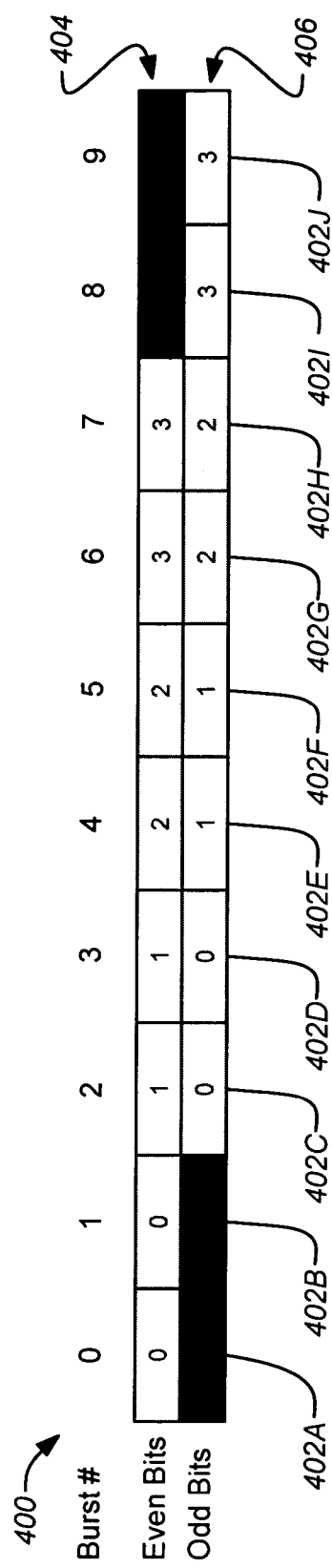
FIG. 4 illustrates the result of interleaving and mapping as described above for half rate speech according to the GSM standard.

FIG. 4 illustrates the result of interleaving and mapping as described above for half rate speech according to the GSM standard. An exemplary interleaver burst sequence 400 is shown with each burst 402-A–402J numbered 0 through 9. Odd bits 404 and even bits 406 within each burst 402A–402J are differentiated. Each incoming half rate speech (HS) frame from the coder, is interleaved over four bursts such that it occupies the even bits of the first two bursts and the odd bits of the next two bursts. A new HS frame starts every two bursts. For example, the bits of frame (or block) 0 from the coder are mapped to the even bits 404 of burst 0 402A and burst 1 402B and the odd bits 406 of burst 2 402C and burst 3 402D.

An HS interleaver in accordance with the present invention can be implemented using only two ten-entry tables and some additional processing. For an exemplary interleaver of the invention, column 'b', the bit index 'k' within the coded frame increases by 38 as the bit index 'j' within the burst increases by 2. The exception to this occurs when the value of 'k' rolls past 227. When this rollover occurs, the initial offset for computing 'k' changes. These offsets can be stored in the two ten-entry tables. Two tables are used because the odd and even interleaver columns have different offset values. However, a single two-dimensional table can also be used. When the value of 'k' rolls past 227, a new offset value is retrieved from the table. Note that the value of 'k' for column 2 is always one greater than the corresponding value for column 0. The same holds true for columns 3 and 1. To illustrate, an exemplary C code implementation is produced as follows.

```
short TCHHSEvenColLUT[ ] = { 0, 18, 8, 28, 4, 22, 12, 34, 16, 36 };
short TCHHSOddColLUT[ ] = { 0, 22, 4, 26, 6, 30, 12, 34, 10, 16 };
COLS_HSPEECH = 6
int i;
int indexA = 0;
int indexB = 0;
int indexC;
for ( i = 0; i < 57; i++ )
{
    indexC = indexA + TCHHSEvenColLUT[indexB];
    interleaver_hspeech[startCol][2*i] = c[indexC];
    interleaver_hspeech[(startCol + 2) % COLS_HSPEECH][2*i + 1] = c[indexC + 1];
    indexA += 38;
    if ( indexA >= 228 )
    {
        indexA -= 228;
        indexB++;
    }
}
indexA = 150;
indexB = 0;
for ( i = 0; i < 57; i++ )
{
    indexC = indexA - TCHHSOddColLUT[indexB];
    interleaver_hspeech[(startCol + 1) % COLS_HSPEECH][2*i] = c[indexC];
    interleaver_hspeech[(startCol + 3) % COLS_HSPEECH][2*i + 1] = c[indexC + 1];
    indexA += 38;
    if ( indexA >= 228 )
    {
        indexA -= 228;
        indexB++;
    }
}
```

Figure 5:
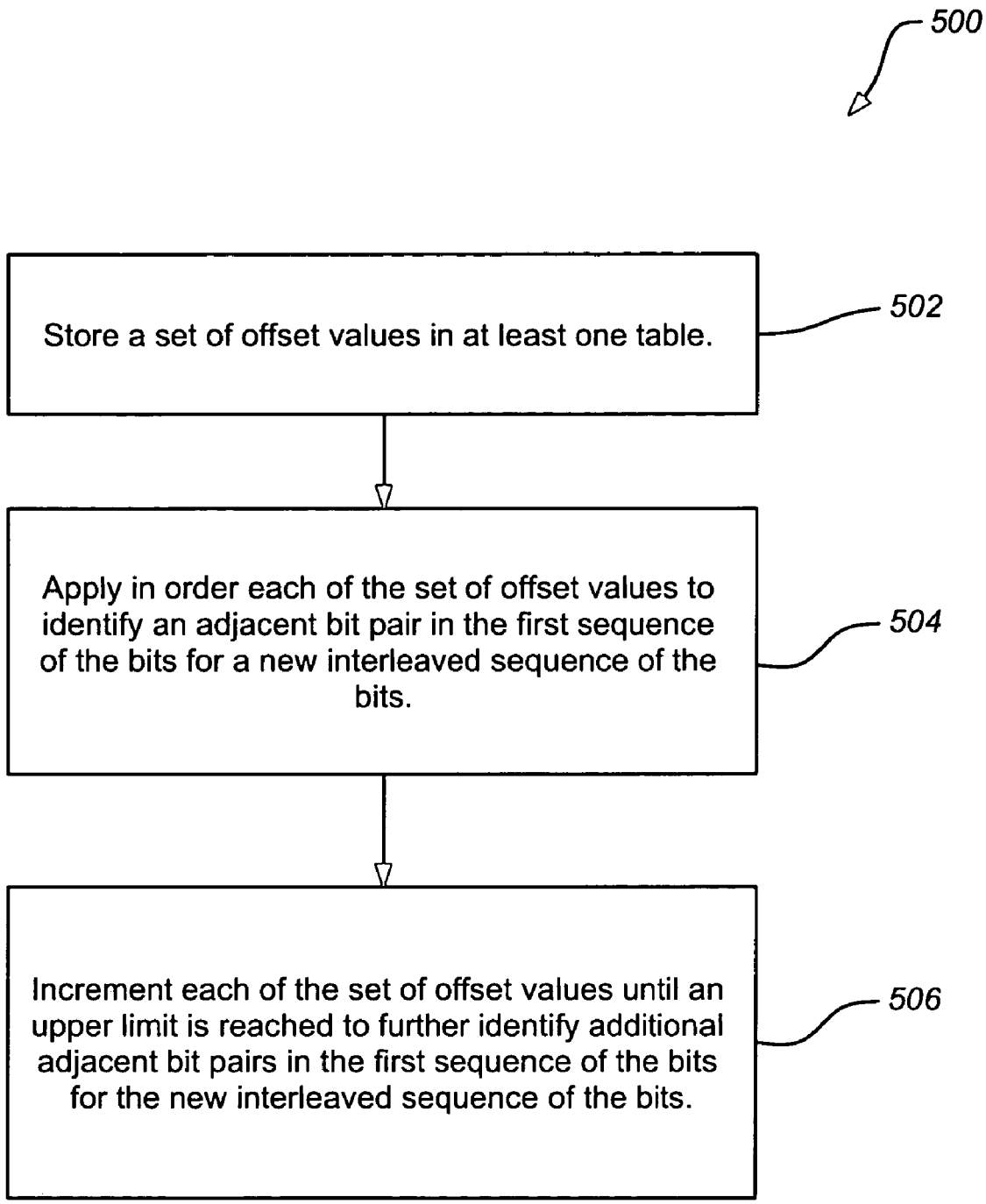
FIG. 5 is a flowchart of an exemplary method of the present invention.

FIG. 5 is a flowchart of an exemplary method of the present invention. The interleaving method 500 begins at step 502 by storing a set of offset values in at least one table. Next, at step 504, each of the set of offset values is applied, in order, to identify an adjacent bit pair in the first sequence of the bits for a new interleaved sequence of the bits. At step 506, each of the set of offset values is incremented until an upper limit is reached to further identify additional adjacent bit pairs in the first sequence of the bits for the new interleaved sequence of the bits. This method improves over conventional interleavers where an offset value is stored for each bit in the incoming sequence to be interleaved. The upper limit can be a total number of the bits in the first sequence and each of the set of offset values is repeatedly incremented by a fixed increment until the upper is reached.

In an exemplary embodiment, for each bit pair, a first bit of the pair can be assigned to a first interleaved sequence of a first interleaved burst. A second bit of the pair can be assigned to a second interleaved sequence of a second interleaved burst. The new interleaved sequence of the bits comprises the first and second interleaved bursts. For example, the first and second interleaved bursts are either even numbered bursts of the new sequence or odd numbered bursts of the new sequence.

In further embodiments of the invention, a first set of offset values and a second set of offset values are stored. The first set of offset values can identify bit pairs for even numbered bursts and the second set of offset values can identify bit pairs for odd numbered bursts for the new interleaved sequence of the bits. The first set of offset values can be stored in a first table and the second set of offset values can be stored in a second table. For example, the first table and the second table can each comprise 10 or fewer offset values. The separate sets of offset values can be associated with different bursts of the new interleaved sequence, e.g., the first set of offset values can determine even numbered bursts and the second set of offset values can determine odd numbered bursts.

In GSM half rate speech interleaving applying the invention, the new interleaved sequence of the bits comprises four bursts including two even numbered interleaved bursts and two odd numbered interleaved bursts and the bit pairs. A first even numbered burst and a first odd numbered burst comprise even numbered bits of the first sequence and a second even numbered burst and a second odd numbered burst comprise odd numbered bits of the first sequence.

In an exemplary embodiment for interleaving half rate speech according to the GSM standard, the first sequence comprises 228 bits. The bits in the first sequence are interleaved across four bursts including two even numbered bursts and two odd numbered bursts. A first even numbered burst and a first odd numbered burst can comprise even numbered bits of the first sequence and a second even numbered burst and a second odd numbered burst can comprise odd numbered bits of the first sequence. For example, 57 even numbered bits of the 228 bits of the first sequence are interleaved as even numbered bits of a first even numbered 114 bit burst (e.g., burst 0) and 57 odd numbered bits of the 228 bits of the first sequence are interleaved as odd numbered bits of a second even numbered 114 bit burst (e.g., burst 2). Similarly, 57 even numbered bits of the 228 bits of the first sequence are interleaved as even numbered bits of a first odd numbered 114 bit burst (e.g., burst 1) and 57 odd numbered bits of the 228 bits of the first sequence are interleaved as odd numbered bits of a second odd numbered 114 bit burst (e.g., burst 3). See FIG. 4. In addition, the odd numbered bits of the new interleaved sequence comprise odd numbered bits of the first sequence and even numbered bits of the new interleaved sequence comprise even numbered bits of the first sequence.

In a specific exemplary GSM interleaver for half rate speech, the first set of offset values comprises {0, 18, 8, 28, 4, 22, 12, 34, 16, 36} and the second set of offset values comprises {0, 22, 4, 26, 6, 30, 12, 34, 10, 16}. The applied rule is that each of the sets of offset values is repeatedly incremented by a fixed value of 38 until an upper limit of 228 (the total number of bits in the first sequence) is reached.

Figure 6:
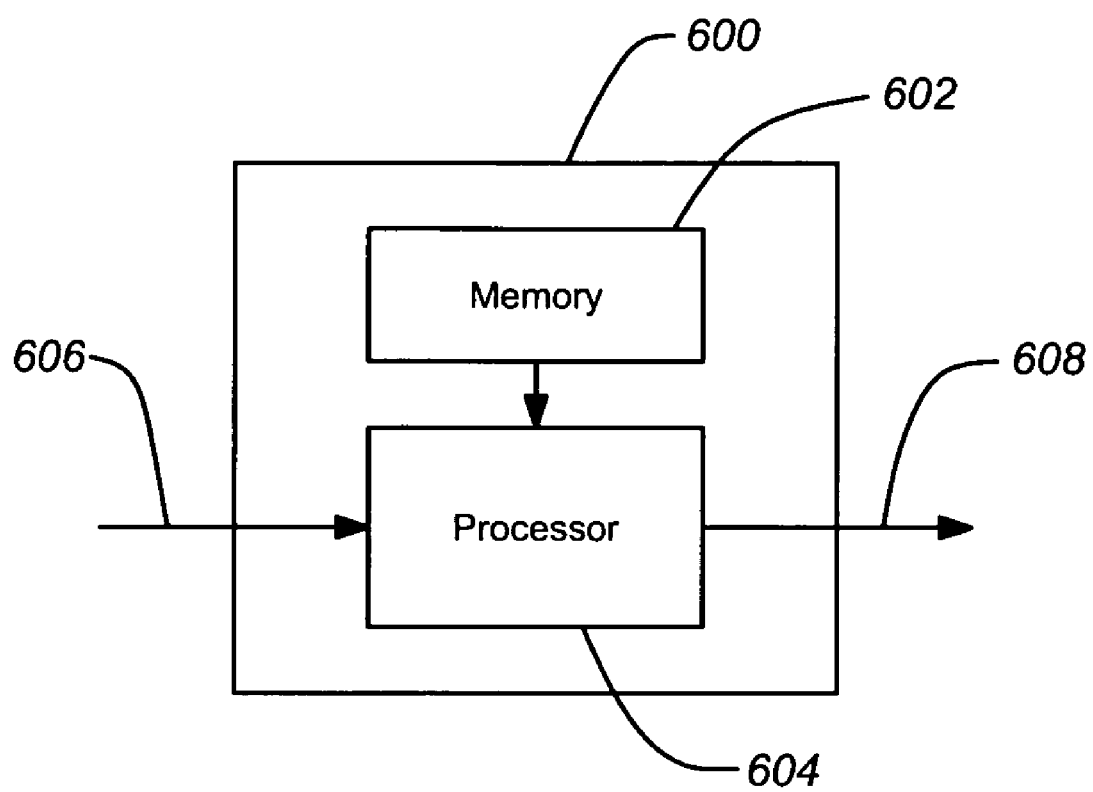
FIG. 6 is a block diagram of an exemplary apparatus of the invention.

FIG. 6 is a block diagram of an exemplary apparatus of the invention. The exemplary interleaver 600 includes a memory 602 for storing the set of offset values and a processor 604 for applying the set of offset values in order by repeatedly incrementing each of the set of offset values until an upper limit is reached to identify a portion of the bits in the first sequence to form a new interleaved sequence of the bits. The processor 604 applies the algorithm using the offset values to determine the new interleaved sequence. The processor applies, in order, each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits. Operation of the processor can be further modified consistent with the method of the invention previously described. The first sequence is received by the interleaver 600 at an input 606, e.g. from a channel coder. The new interleaved sequence can be communicated to a burst assembler at an output 608. Refer to FIG. 1.

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture, operation and use of the apparatus and method of the invention. Since many embodiments of the invention can be made without departing from the scope of the invention, the invention resides in the claims hereinafter appended.

What is claimed is:

1. A method of interleaving bits in a first sequence, comprising the steps of:
   storing a set of offset values in at least one table;
   applying in order each of the set of offset values to identify an adjacent bit pair in the first sequence of the bits for a new interleaved sequence of the bits; and
   incrementing each of the set of offset values until an upper limit is reached to further identify additional adjacent bit pairs in the first sequence of the bits for the new interleaved sequence of the bits.

2. The method of claim 1, wherein, for each bit pair, a first bit of the pair is assigned to a first interleaved sequence of a first interleaved burst and a second bit of the pair is assigned to a second interleaved sequence of a second interleaved burst and the new interleaved sequence of the bits comprises the first and second interleaved bursts.

3. The method of claim 2, wherein the new interleaved sequence of the bits comprises four bursts including two even numbered interleaved bursts and two odd numbered interleaved bursts and the bit pairs.

4. The method of claim 3, wherein a first even numbered burst and a first odd numbered burst comprise even numbered bits of the first sequence and a second even numbered burst and a second odd numbered burst comprise odd numbered bits of the first sequence.

5. The method of claim 1, wherein storing the set of offset values in at least one table comprises storing a first set of offset values and a second set of offset values.

6. The method of claim 5, wherein the first set of offset values are stored in a first table and the second set of offset values are stored in a second table.

7. The method of claim 6, wherein the first table and the second table each comprise 10 or fewer offset values.

8. The method of claim 5, wherein the first set of offset values identifies bit pairs for even numbered bursts and the second set of offset values identifies bit pairs for odd numbered bursts for the new interleaved sequence of the bits.

9. The method of claim 5, wherein the first set of offset values comprises {0, 18, 8, 28, 4, 22, 12, 34, 16, 36} and the second set of offset values comprises {0, 22, 4, 26, 6, 30, 12, 34, 10, 16}.

10. The method of claim 1, wherein the upper limit is a total number of the bits in the first sequence and each of the set of offset values is repeatedly incremented by a fixed increment until the upper is reached.

11. The method of claim 10, wherein the fixed value is 38 and the first sequence is 228 bits.

12. The method of claim 1, wherein odd numbered bits of the new interleaved sequence comprise odd numbered bits of the first sequence and even numbered bits of the new interleaved sequence comprise even numbered bits of the first sequence.

13. The method of claim 1, wherein the first sequence comprises 228 bits.

14. An apparatus for interleaving bits in a first sequence, comprising:
   a memory for storing a set of offset values in at least one table; and
   a processor for applying in order each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits.

15. The apparatus of claim 14, wherein, for each bit pair, a first bit of the pair is assigned to a first interleaved sequence of a first interleaved burst and a second bit of the pair is assigned to a second interleaved sequence of a second interleaved burst and the new interleaved sequence of the bits comprises the first and second interleaved bursts.

16. The apparatus of claim 15, wherein the new interleaved sequence of the bits comprises four bursts including two even numbered interleaved bursts and two odd numbered interleaved bursts and the bit pairs.

17. The apparatus of claim 16, wherein a first even numbered burst and a first odd numbered burst comprise even numbered bits of the first sequence and a second even numbered burst and a second odd numbered burst comprise odd numbered bits of the first sequence.

18. The apparatus of claim 14, wherein storing the set of offset values in at least one table comprises storing a first set of offset values and a second set of offset values.

19. The apparatus of claim 18, wherein the first set of offset values are stored in a first table and the second set of offset values are stored in a second table.

20. The apparatus of claim 19, wherein the first table and the second table each comprise 10 or fewer offset values.

21. The apparatus of claim 18, wherein the first set of offset values identifies bit pairs for even numbered bursts and the second set of offset values identifies bit pairs for odd numbered bursts for the new interleaved sequence of the bits.

22. The apparatus of claim 18, wherein the first set of offset values comprises {0, 18, 8, 28, 4, 22, 12, 34, 16, 36} and the second set of offset values comprises {0, 22, 4, 26, 6, 30, 12, 34, 10, 16}.

23. The apparatus of claim 14, wherein the upper limit is a total number of the bits in the first sequence and each of the set of offset values is repeatedly incremented by a fixed increment until the upper is reached.

24. The apparatus of claim 23, wherein the fixed value is 38 and the first sequence is 228 bits.

25. The apparatus of claim 14, wherein odd numbered bits of the new interleaved sequence comprise odd numbered bits of the first sequence and even numbered bits of the new interleaved sequence comprise even numbered bits of the first sequence.

26. The apparatus of claim 14, wherein the first sequence comprises 228 bits.

27. An apparatus for interleaving bits in a first sequence, comprising:
    means for storing a set of offset values in at least one table; and
    means for applying in order each of the set of offset values to identify an adjacent bit pair in the first sequence of the bits for a new interleaved sequence of the bits and incrementing each of the set of offset values until an upper limit is reached to further identify additional adjacent bit pairs in the first sequence of the bits for the new interleaved sequence of the bits.

* * * * *